(12) United States Patent
Chen

(10) Patent No.: US 6,208,178 B1
(45) Date of Patent: Mar. 27, 2001

(54) CMOS OVER VOLTAGE-TOLERANT OUTPUT BUFFER WITHOUT TRANSMISSION GATE

(75) Inventor: Baohua Chen, Mountain View, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/511,011

(22) Filed: Feb. 23, 2000

(51) Int. Cl.[7] ....................................................... H03K 5/08
(52) U.S. Cl. .............................. 327/108; 327/112; 326/27
(58) Field of Search .................................... 327/315, 318, 327/312, 309, 328, 108, 112, 333, 379, 387, 388, 389, 391; 326/26, 27, 62, 82, 83, 87

(56) References Cited

U.S. PATENT DOCUMENTS

| | | | |
|---|---|---|---|
| 4,871,927 | 10/1989 | Dallavalle | 327/546 |
| 5,004,936 | * 4/1991 | Andresen | 326/27 |
| 5,117,129 | 5/1992 | Hoffman et al. | 326/13 |
| 5,570,043 | * 10/1996 | Churchill | 326/81 |
| 5,576,635 | 11/1996 | Partovi et al. | 326/27 |
| 5,635,860 | 6/1997 | Westerwick | 326/81 |
| 5,721,508 | * 2/1998 | Rees | 327/382 |
| 5,748,011 | 5/1998 | Takahashi et al. | 326/83 |
| 5,764,077 | 6/1998 | Andresen et al. | 326/34 |
| 5,844,425 | 12/1998 | Nguyen et al. | 326/58 |
| 5,864,245 | 1/1999 | Watarai | 326/81 |
| 5,933,025 | 8/1999 | Nance et al. | 326/81 |
| 5,933,027 | 8/1999 | Morris et al. | 326/81 |

\* cited by examiner

Primary Examiner—Tuan T. Lam
Assistant Examiner—Hiep Nguyen
(74) Attorney, Agent, or Firm—Stuart T. Auvinen

(57) ABSTRACT

An isolating output buffer is operated by a low-voltage Vcc power supply, yet can be put in a high-impedance state. The output buffer does not draw significant current when its output is driven by an external driver to a voltage above Vcc. The over-voltage on the output pad is coupled to the n-well under p-channel transistors through a fixed-gate p-channel transistor. The over-voltage from the n-well is then coupled to a source node through another p-channel transistor. The source node is the source of a p-channel transistor that drives the gate of a p-channel driver transistor driving the output pad. The source node is normally driven to Vcc by another p-channel transistor. The p-channel transistor can be split into two driver transistors that are separately driven by two isolating inverters or gates. The isolating gates have p-channel transistors connected to the source node. Using split drivers can reduce noise and di/dt when the two driver transistor are enabled at slightly different times. The output buffer is implemented entirely in CMOS without using bipolar transistors. The isolating output buffer is faster because it does not use a transmission gate in the speed path.

20 Claims, 5 Drawing Sheets

CMOS OVER VOLTAGE-TOLERANT OUTPUT BUFFER WITHOUT TRANSMISSION GATE

FIELD OF THE INVENTION

This invention relates to output buffers, and more particularly for CMOS output buffers with isolation during bus over-voltage.

BACKGROUND OF THE INVENTION

As integrated circuit (IC) device geometries shrink, lower power-supply voltages are used to prevent device failures. The standard 5-volt supply has dropped to 3 volts and below. Switching from 5 volts to 3 volts results in a 34% reduction in the electric fields carried across a device such as a complementary metal-oxide-semiconductor (CMOS) transistor. The lower power-supply voltage significantly reduces adverse side effects and power consumption and heat generation.

However, it has not been possible to convert all electronic devices to the new lower-volt standard. Thus a system designer often has to use an older 5-volt IC with a newer 3-volt IC. For example, a newer microprocessor may operate at 3 volts, while data buffers attached to that microprocessor may only be available in 5-volt IC's. In the communications field, a newer 3-volt device may have to drive a bus that is also driven by older 5-volt devices.

FIG. 1 illustrates a bus that must be driven by both 3-volt and 5-volt devices. Several drivers 10, 14, 16 can connect to bus 12. However, only one of drivers 10, 14, 16 will be driving bus 12 at any one time. The other drivers will be in a high-impedance state. For example, when driver 14 is driving data out onto bus 12, drivers 10 and 16 are in a high-impedance state and do not drive data out onto bus 12. A driver in a high-impedance state only draws a small amount of current from bus 12, otherwise it could alter the logic level appearing on bus 12. In fact, if it draws a large current when in a high-impedance state it could even damage the driver.

Bus 12 has a low logic-level of about 0 volts but a high logic-level of 3 to 5 volts. Thus older devices such as driver 14, which operate off a 5-volt power supply, drive bus 12 to 0 or 5 volts. Newer devices, such as driver 16, operate off a 3-volt power supply and drive bus 12 to 0 or 3 volts. Thus a high logic-level output from driver 14 will be about 5 volts, while a high logic-level output from driver 16 is about 3 volts.

Newer 3-volt drivers such as driver 10 must be able to connect to bus 12 even when bus 12 is at 5 volts, which is 2 volts higher than the power supply of 3 volts powering driver 10. Since bus 12 operates at high speeds, it is not feasible to mechanically disconnect a driver in a high-impedance state from bus 12, as with a mechanical relay. Electrical circuit means are needed to isolate a driver in a high-impedance state from bus 12.

FIG. 2 is an output buffer using CMOS transistors and gates that can be placed in a high-impedance state. A large n-channel driver transistor 20 pulls bus 12 low, to ground or 0 volts, when it is turned on. The body terminal of transistor 20 is connected to ground, as indicated by the dashed line coming from the channel of transistor 20. Since the source of transistor 20 is also connected to ground, once the gate voltage exceeds the n-channel threshold voltage of about 0.7 volts, transistor 20 will turn on and conduct between its drain (tied to bus 12), and its source (ground).

The gate of transistor 20 is driven by inverter 22, which is driven by NAND gate 26. The output of NAND gate 26 is low, and thus transistor 20 drives bus 12 low, when the enable signal EN is high and the input voltage $V_{IN}$ is high.

A large p-channel driver transistor 18 pulls bus 12 high, to the power supply or 3 volts, when it is turned on. The body terminal of p-channel transistor 18 is connected to the power supply, as indicated by the dashed line coming from the channel of transistor 18. Since the source of transistor 18 is also connected to the power supply, once the gate voltage is less than the power supply by the magnitude of the p-channel threshold voltage of about −0.7 volts, transistor 18 will turn on and conduct between its source (the power supply), and its drain (tied to bus 12).

The gate of p-channel transistor 18 is driven by inverter 24, which is driven by NOR gate 28. The output of NOR gate 28 is high, and thus p-channel transistor 18 drives bus 12 high, when the inverse enable signal $\overline{EN}$ is low and the input voltage $V_{IN}$ is low. Thus $V_{IN}$ is inverted and driven out on bus 12 when the enable signals EN, $\overline{EN}$ are active (1 and 0, respectively).

Isolation Difficult

Isolating a high-impedance driver using only CMOS transistors is a difficult design problem. Isolating n-channel transistor 20 of FIG. 2 is easily accomplished by driving zero volts on its gate. The gate-to-source voltage is thus 0 volts, which is less than the n-channel threshold voltage of about 0.7 volts. Thus n-channel transistor 20 will not conduct, regardless of whether 3 volts or 5 volts is applied to bus 12, which is coupled to the drain of transistor 20. Since the p-well or p-substrate of n-channel transistor 20 is also connected to ground, as indicated by the body terminal or transistor 20 being tied to ground, the parasitic diode between the n+ drain and the p-substrate will be reverse biased at both 3 and 5 volts on the drain. Thus there would be only a very small leakage current from the n+ drain or the channel or n-channel transistor 20.

However, isolating the p-channel transistor 18 when bus 12 is at 5 volts is problematic. This isolation problem of the prior art is illustrated in FIG. 3, which shows a cross-section of p-channel driver transistor 18 of FIG. 2. P-channel transistor 18 has a gate 36, a source 38, and a body terminal 40 all tied to the power supply of 3 volts. Thus n-well 32 is at 3 volts because of the connection of the n+ well tap or body terminal 40 to the n-well 32. The p-substrate 34 is biased to ground by a p+ substrate tap (not shown).

When bus 12 is being driven to 5 volts by another driver, little or no current should be drawn from bus 12 through p+ drain 30 as the device should be put in a high-impedance state. However, very large currents can be drawn through p+ drain 30. Two mechanisms can draw current. First, p-channel transistor 18 will turn on and conduct through channel 41 between p+ source 38 and p+ drain 30. P-channel transistor 18 turns on because the 5 volts on p+ "drain" 30 is 2 volts above the 3 volt gate voltage on gate 36. Thus p+ "drain" 30 reverses roles and act as a source, while p+ "source" 38 acts as the drain, since it is at 3 volts. Thus p-channel transistor 18 is tuned on and conducts current from bus 12 to the 3-volt power supply connected to p+ "source" 38. This can be a large current because transistor 18 is a large driver transistor that must drive the relatively high-capacitance bus 12. Transistor 18 could draw tens of milli-amps (mA's), depending upon the size of transistor 18.

In the second mechanism, the p+ drain 30 within n-well 32 forms a parasitic diode 42. This diode 42 is forward biased, since p+ drain 30 is at 5 volts while n-well 32 is at 3 volts. Thus diode 42 is forward biased by 2 volts and can draw significant current. This current can trigger latch-up in a parasitic SCR formed by a parasitic PNP transistor of the p+ drain 30 as the emitter, n-well 32 base, and p-substrate 34 as a collector, and a second parasitic NPN transistor formed from n+ terminal 40 as the collector, p-substrate 34 as the base, and another n+ drain or source as the emitter (not shown) in the p-substrate.

Isolation Using Transmission Gate

A related U.S. Pat. No. 5,444,397 by Wong et al., and assigned to Pericom Semiconductor Corp. of San Jose, Calif., disclosed an isolation circuit that connected a higher-voltage output to the gate and substrate of p-channel transistors to provide bus isolation.

FIG. 4 is cross-section of a p-channel driver transistor 18' being biased for isolation with the biasing circuitry of U.S. Pat. No. 5,444,397. The gate 36' of transistor 18' is biased to 5 volts rather than just to 3 volts. This prevents a channel from forming under gate 36', which also prevents transistor 18' from turning on and conducting current. Additionally, n-well 32' is biased to 5 volts rather than just 3 volts. Biasing circuitry shown in FIG. 5 drives 5 volts to well tap or body terminal 40'. Source 38' is coupled to the normal 3-volt power supply. Thus the parasitic diode 42' is biased to 0 volts when 5 volts is applied to drain 30' by a 5-volt device driving bus 12. Since parasitic diode 42' requires about 0.3 to 0.7 volts of forward bias to turn on and conduct, parasitic diode 42' does not conduct.

FIG. 5 shows the biasing circuit of U.S. Pat. No. 5,444,397. The output pad, bus 12 is input to the circuit and coupled to the drain 30' of p-channel driver transistor 18'.

Transmission gate 50 is provided to isolate gate 36' of p-channel driver transistor 18', since this gate is biased to 5 volts for isolation. Thus transmission gate 50 prevents the 5 volt isolation signal on gate 36' from being connected to the $\overline{EN^*Y_{IN}}$ input and the rest of the circuitry on the device. The drain of transistor 53 is coupled to gate 36' to drive 5 volts onto gate 36' during isolation.

When all of its input are high, indicating that isolation is necessary, NAND gate 60 drives node 62 low. When isolation is not necessary, when any of the inputs to gate 60 are low, then node 62 is driven high. Node 62 is inverted as node 64 by transistors 57, 56, which receive node 62 on their gates while their drains drive node 64. The source of transistor 56 is coupled to bus 12 rather than the 3-volt power supply so than node 64 may be driven to 5 volts when bus 12 is driven to 5 volts, rather than just 3 volts. P-channel transistors 54, 55 drive the n-well 32' through n-well tap 40'. Transistor 54 is turned on and drives the n-well 32' to 3 volts when isolation is not signaled, when node 64 is low. However, when isolation is signaled by node 64 being high, then transistor 54 is turned off. Instead, channel transistor 55 turns on as its source, which is coupled to bus 12, surpasses its 3-volt gate voltage by the magnitude of the p-channel threshold voltage. When bus 12 is below 3+$|V_{tp}|$ volts, then transistor 55 is cut off and does not conduct. Thus as the voltage on bus 12 rises above about 3.7 volts, transistor 55 couples n-well 32' to the voltage on bus 12 from the 5-volt driver.

The body terminals of p-channel transistors 51, 53, 54, 55, 56, and the p-channel driver transistor 18' are all electrically connected because they are formed in the same n-well 32'. This connection is shown by the dashed line 32' connecting the body terminals of these transistors in FIG. 5.

While the buffer circuit of FIG. 5 is useful, there are some drawbacks that have become apparent to the inventor. Transmission gate 50 adds an unwanted delay, especially as transistor 18' is increased in size relative to transmission gate 50. Transmission gate 50 acts as a series resistance when the gate of transistor 18' is being discharged, increasing the propagation delay of the output buffer. A larger upstream driver (not shown) may be needed to drive signal $\overline{EN^*V_{IN}}$ through transmission gate 50. It is desire to eliminate the series-resistance through transmission gate 50. A faster buffer is desired that still provides isolation when the output bus is driven externally to a voltage above the power-supply voltage.

What is desired is an isolating output buffer that is operated by a low-voltage power supply, yet can be put in a high-impedance state and not draw significant current when the bus is being driven by another driver to a higher voltage, such as 5 volts. The output buffer should be implemented entirely in CMOS without using bipolar transistors. It is desired to avoid using a charge pump, a second power-supply voltage, or a complex op-amp comparator. A faster isolating output buffer is desired that does not use a transmission gate in the speed path.

SUMMARY OF THE INVENTION

An output buffer drives a bus. The output buffer has an input, an output, an n-well substrate node, and a middle node. A p-channel driver transistor has a gate controlled by a driver-gate node, a drain coupled to the output, and a source coupled to a power supply. A logic gate has the output as an input. It generates a first signal. A high-voltage inverter receives the first signal. It generates a second signal.

A first p-channel transistor has a gate coupled to the power supply, a drain coupled to the n-well substrate node, and a source coupled to the output. A second p-channel transistor, has a gate coupled to the second signal, a drain coupled to the power supply, and a drain coupled to the n-well substrate node. A third p-channel transistor has a gate controlled by the second signal, a drain coupled to the middle node, and a source coupled to the power supply. A fourth p-channel transistor has a gate controlled by the first signal, a drain coupled to the middle node, and a source coupled to the n-well substrate node.

A source-isolated inverter includes an n-channel transistor with a gate coupled to the input, a drain coupled to the driver-gate node, and a source coupled to ground. A p-channel transistor has a gate coupled to the input, a drain coupled to the driver-gate node, and a source coupled to the middle node. Thus the source-isolated inverter drives the p-channel driver transistor from the middle node which is driven through the fourth p-channel transistor, the n-well substrate node, and the first p-channel transistor from the output when the first signal is low.

In further aspects of the invention the n-well substrate node is coupled to substrate areas under channels of the first, second, third, and fourth p-channel transistors, the p-channel driver transistor, and the p-channel transistor in the source-isolated inverter. The n-well substrate node is not directly connected to the power supply but is connected to the power supply through the second p-channel transistor or is connect to the output by the first p-channel transistor.

In still further aspects the high-voltage inverter has a p-channel transistor with a gate controlled by the first signal, a drain driving the second signal, and a source coupled to the output. An n-channel transistor has a gate controlled by the first signal, a drain driving the second signal, and a source coupled to a ground. Thus the source of the p-channel transistor is driven by the over-voltage from the output.

In other aspects the logic gate has a first input connected to the output and a second input connected to an output-disabling signal. The first signal is low when the output-disabling signal indicates that the output buffer not drive the output and the output is in a high state. Thus the output is connected to the n-well substrate node when the first sign is low.

DETAILED DESCRIPTION

The present invention relates to an improvement in isolating output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the transmission gate of the previous isolating output buffer can be eliminated. This reduces propagation delay. The function of the transmission gate was to isolate the gate of the p-channel driver transistor when the output bus is above the power-supply voltage. An isolating inverter is used to drive the gate of the p-channel driver transistor.

The isolating inverter has the source of its p-channel transistor connected to the power supply during normal operation. During isolating mode, this source is driven to the super-voltage through a connecting channel transistor to the substrate, which is connected to the super voltage. Thus the gate of the p-channel driver transistor is driven above the power-supply voltage using a connection through the substrate.

Figure 6:
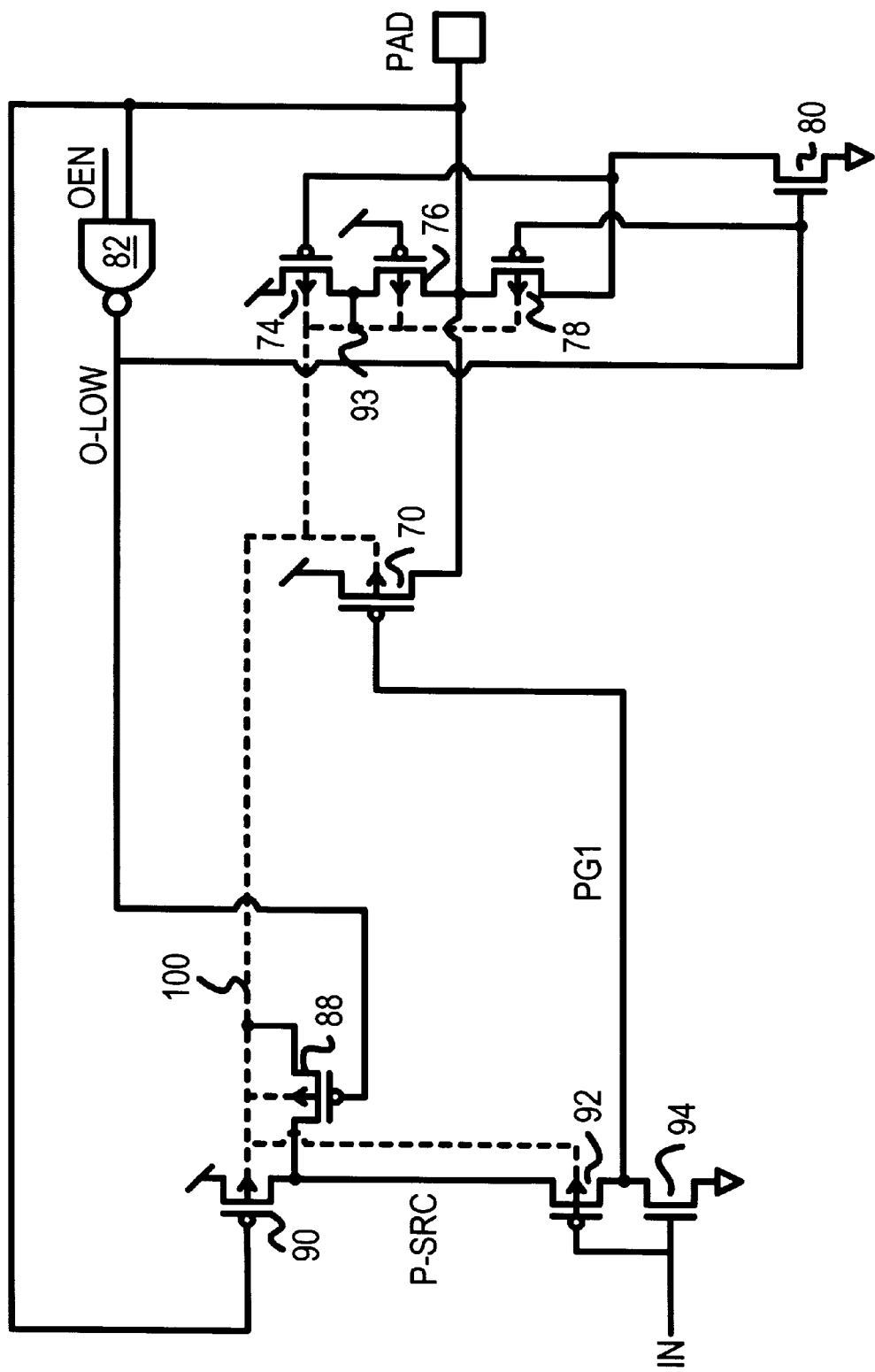
FIG. 6 is a schematic of an isolating output buffer without a transmission gate.

Basic Schematic - FIG. 6

Figure 1:
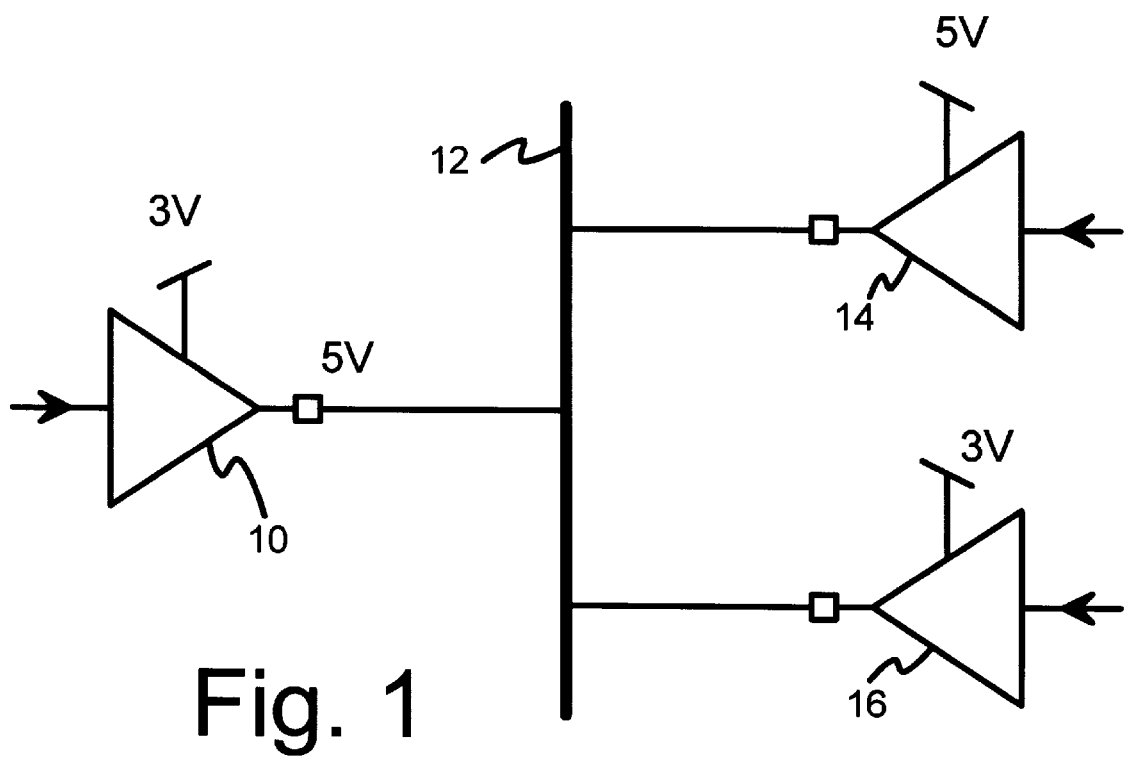
FIG. 1 illustrates a bus that must be driven by both 3-volt and 5-volt devices.
Figure 2:
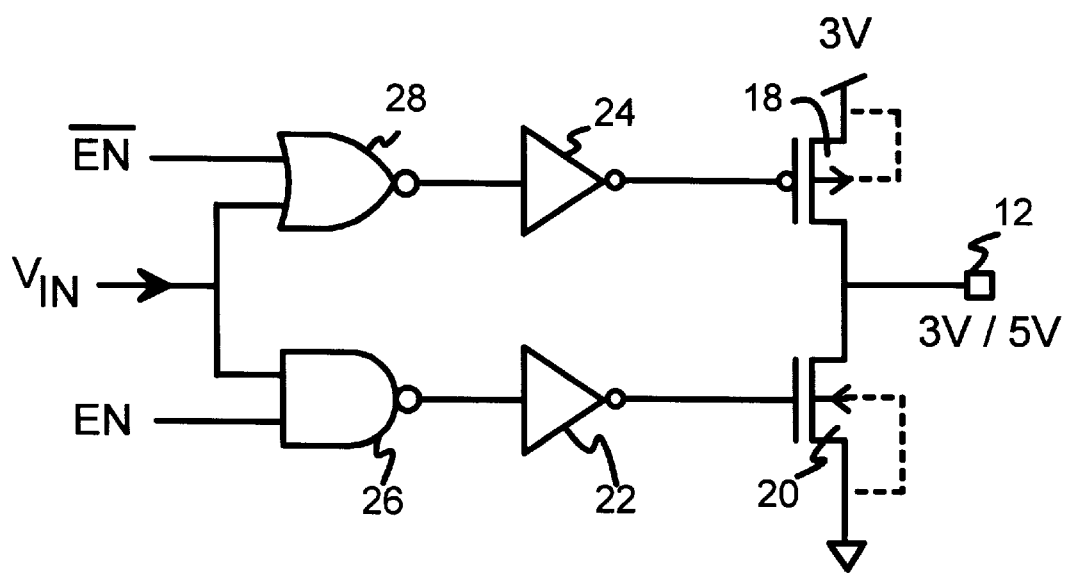
FIG. 2 is an output buffer using CMOS transistors and gates that can be placed in a high-impedance state.
Figure 3:
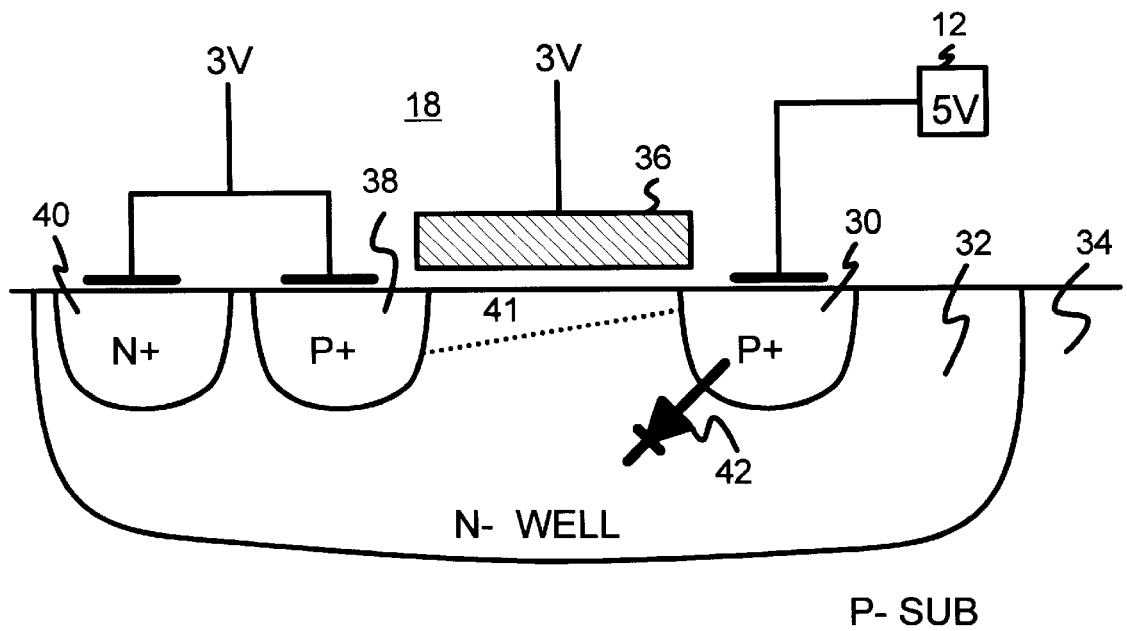
FIG. 3 shows a cross-section of the p-channel driver transistor of FIG. 2.
Figure 4:
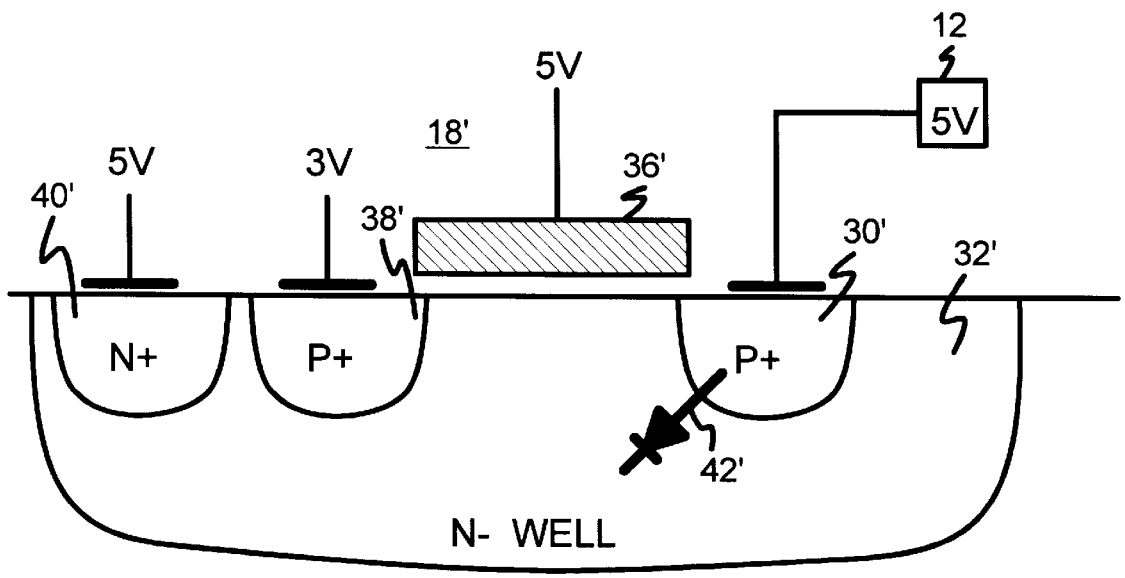
FIG. 4 is cross-section of a p-channel driver transistor 18' being biased for isolation with the biasing circuitry of U.S. Pat. No. 5,444,397.
Figure 5:
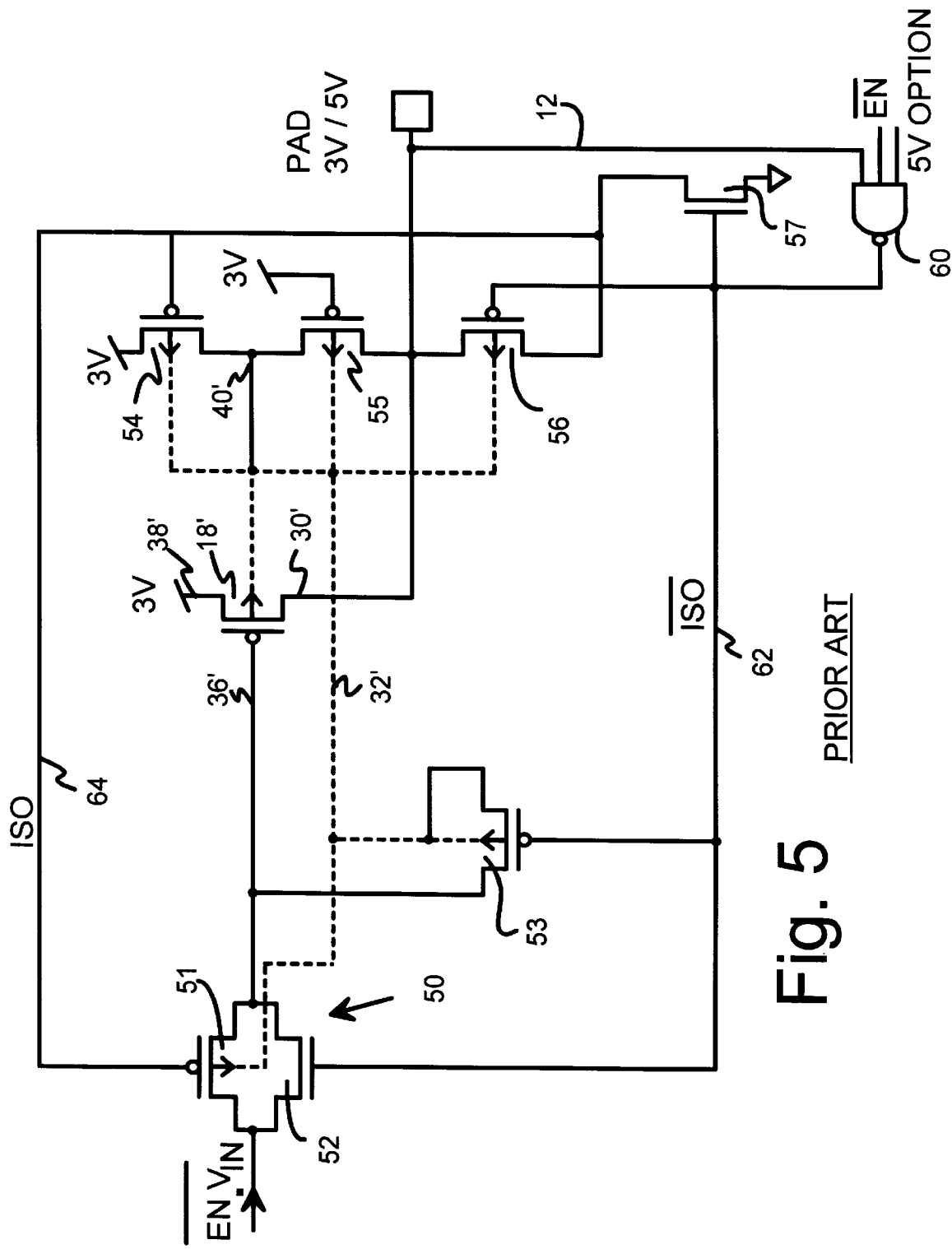
FIG. 5 shows the biasing circuit of U.S. Pat. No. 5,444,397.

FIG. 6 is a schematic of an isolating output buffer without a transmission gate. An external bus connected to the output pad is input to the circuit and coupled to the drain of large p-channel driver transistor 70. An n-channel driver transistor (not shown) has its drain also coupled to the output pad. This n-channel driver transistor is not shown in FIG. 6 because no special biasing is needed for the n-channel driver transistor. Indeed, the prior-art high-impedance output buffer of FIG. 2 can be used with the present invention by replacing its p-channel driver transistor 18 with the biasing circuit of FIG. 6.

When the external bus connected to the output pad is driven above the power supply by an external driver, an isolation mode is enabled. NAND gate 82 receives the high voltage from the output pad and also received output-enable-bar OEN. OEN is high to indicate that the output buffer is in the high-impedance state. When both inputs are high, NAND gate 82 drives O-LOW low.

N-channel transistor 80 and p-channel transistor 78 invert O-LOW to a high signal during isolation. Since the source of p-channel transistor 78 is connected to the output pad rather than to the internal power supply, p-channel transistor 78 drives its output to the 5-volt super-voltage rather than just to the 3-volt Vcc. This super voltage output from transistor 78 is applied to the gate of p-channel supply transistor 74, completely turning it off during isolation.

The gate of P-channel transistor 76 is connected to the internal 3-volt power supply. P-channel transistor 76 turns on when its source, which is coupled to the output pad, surpasses its 3-volt gate voltage by the magnitude of the p-channel threshold voltage. When the output pad is below $3+|V_{tp}|$ volts, often transistor 76 is cut off and does not conduct. However, as the voltage on the output pad rises above about 3.7 volts, transistor 76 couples n-well 100 to the super-voltage on the output pad.

P-channel transistors 74, 76 drive n-well 100 through n-well tap 93. Transistor 74 is turned on and drives n-well 100 to 3 volts when isolation is not signaled, when NAND gate 82 drives O-LOW high. However, when isolation is signaled by O-LOW being low, then transistor 74 is turned off. Instead, p-channel transistor 76 turns on as its source, which is coupled to the output pad, rises above Vcc.

N-Well 100 connects to the substrate terminals of channel transistors 74, 76, 78, 88, 90, 92 as well as to the substrate terminal of p-channel driver transistor 70. These p-channel transistors are protected from substrate latch-up or damage from the overvoltage on the output pad since this over voltage is applied to their substrates.

The gate node PG1 of p-channel driver transistor 70 must also be connected to the over-voltage on the output pad to prevent it from tuning on during isolation. Gate node PG1 is biased to the output bus over-voltage (5 volts in this example) for isolation. An isolating inverter including transistors 90, 92, 94 prevents the 5 volt isolation signal on the gate PG1 of driver transistor 70 from being connected to the rest of the circuitry on the device.

Node PG1 is driven to the over voltage through p-channel transistors 88, 92 during isolation. Substrate node n-well 100 is connected to the output pad by p-channel connecting transistor 76, which turns on for an over-voltage during isolation. Thus substrate n-well 100 is at the over voltage. The gates of p-channel transistors 88, 92 are connected to inverted signals during isolation. O-LOW is low during isolation, turning on p-channel transistor 88. P-channel transistor 88 then connects the over voltage on n-well 100 to the channel source node P-SRC. P-channel transistor 92 is off, since its gate is connected to the high output voltage.

The over voltage on P-SRC is coupled through p-channel transistor 92 to gate node PG1. Thus during isolation the gate (node PG1) of p-channel driver transistor 70 is driven to the over voltage, as is its substrate, n-well 100. This protects driver transistor 70 from turning on or latching up.

When isolation is not necessary, one or more of the inputs to NAND gate 82 is low. Then node O-LOW is driven high.

P-channel transistor 88 is off, but p-channel transistor 90 is on, coupling the internal Vcc to P-SRC. O-LOW is inverted by transistors 78, 80, which receive node O-LOW on their gates. Transistor 74 is turned on and drives the n-well 100 to the 3 volt Vcc.

The substrate (body) terminals of p-channel transistors 74, 76, 78, 88, 90, 92 and the p-channel driver transistor 70 are all electrically connected because they are formed in the same n-well 100. This connection is shown by the dashed line 100 connecting the body terminals of these transistors in FIG. 6. Metal well straps and additional n+ well taps such as 93 may be placed between and near these transistors to reduce the parasitic resistance of the n-well 100.

Using the isolating inverter of transistors 88, 90, 92, 94 eliminates the need for a transmission gate for isolation. The series resistance of the transmission gate is eliminated, providing for a faster propagation delay. Additional delay occurs only when PG1 is driven high, not when PG1 is driven low. Since the low-going PG1 occurs when driver transistor 70 is being turned on, the turn-on delay is not increased. N-channel transistor 94 pulls down node Pal without any series resistance.

When node PG1 is pulled up, when the driver is being disabled, an additional delay occurs through p-channel transistor 90 or 88. However, the disable time is usually less critical than the enable delay of an output buffer. Thus delay is added for the less-critical output transition while no delay is added to the critical transition. A more optimized buffer is the result.

Figure 7:
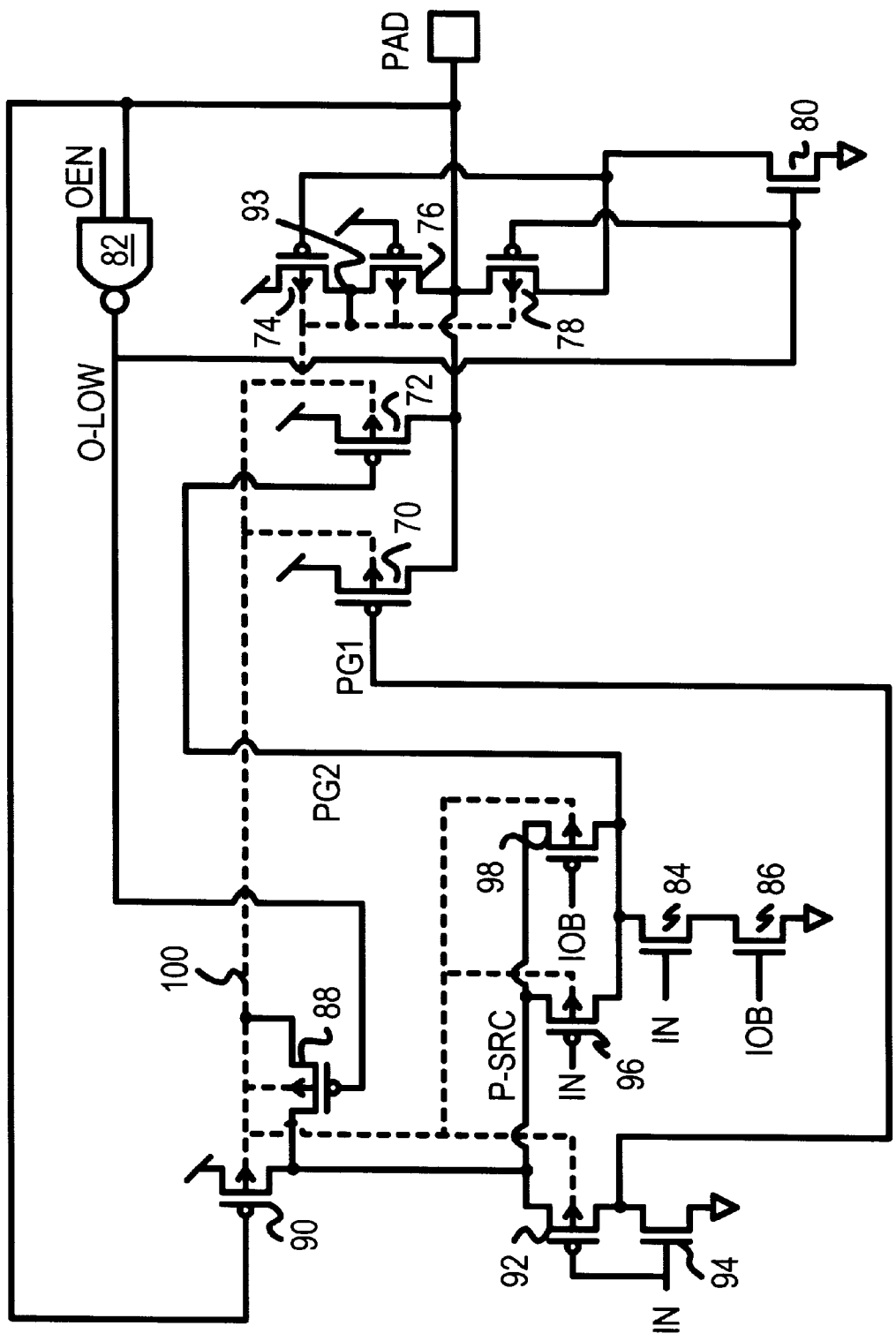
FIG. 7 shows an alternate embodiment using a split driver.

Split Driver Buffer- FIG. 7

FIG. 7 shows an alternate embodiment using a split driver. The large driver transistor 70 of FIG. 6 is split into two driver transistors 70, 72. Using split drivers allows one to be turned on slightly after the other. This reduces the surge in current when the driver is enabled. The lower current surge reduces di/dt, and also reduces ground or power-supply bounce. Reduced noise results.

NAND gate 82 drives F-LOW low when isolation is required, when the output pad is high and the output in the high-impedance state. Transistors 78, 80 invert O-LOW, driving a high voltage onto the gate of channel transistor 74. This high voltage is the pad voltage above Vcc, causing transistor 74 do disconnect n-well 100 from Vcc. Instead, p-channel transistor 76 turns on, connecting n-well 100 to the over voltage on the output pad.

P-channel transistor 88 connects P-SRC to the over voltage on n-well 100, while p-channel transistor 90 is turned off, disconnecting P-SRC from Vcc. P-SRC is normally connected to Vcc by transistor 90.

The driver transistor is split into two driver transistors 70, 72, driven by separate gate nodes PG1, PG2. The first gate node PG1 is enabled by n-channel transistor 94 before the second gate node PG2 is enabled by n-channel transistors 84,86, since transistors 84, 86 are in series and result in a longer delay to charge the gate PG2 of driver transistor 72. This skew is intentional, being designed to reduce the initial current surge from driver transistors 70, 72.

P-SRC forms a pseudo-source for two isolating inverters. Transistors 92, 94 drive PG1 and driver transistor 70, while transistors 96, 98, 84, 86 form a second isolating gate that drives PG2 and driver transistor 72. P-channel transistors 92, 96, 98 all have their sources connected to node P-SRC, which is driven to the over voltage by transistor 88, or to Vcc by transistor 90.

The second isolating gate is a NAND gate, with input IN and 10B. The first isolating inverter receives IN. The additional signal 10B is normally set high, but can be set low to disable second driver transistor 72. 10B may be set low when a lower output current is desired for a particular application.

The relative sizes of the transistors in the two isolating gates can be adjusted to the desired tiring skew between PG1 and PG2. For example, transistors 92, 94 could be enlarged to turn on driver transistor 70 earlier. The 10B option could be removed or replaced with a different circuit arrangement, such as a NOR gate rather than a NAND gate that drives node PG2.

Isolation when Bus Driven to 5 Volts

When all inputs to NAND gate 82 are high, 5-volt isolation is required. The output buffer is in a high-impedance state since signal OEN is high. Although operating from a 3-volt supply, NAND gate 82 also receives the output pad as an input. Since NAND gate 82 is constructed from CMOS transistors, the output pad is isolated from the 3-volt power supply since the output pad is only connected to gates of transistors in NAND gate 82. These gates are typically formed of polysilicon and are separated from the rest of the transistor by gate oxide and insulation. Inputting a 5-volt signal on the output pad is seen as a logic one.

If the output pad is low, then the O-LOW output from NAND gate 82 is high, and the circuit operates in the manner described above, even though it may be in the high-impedance state. However, when the output pad goes above 3 volts, special isolation is needed. The output from NAND gate 82 goes low, which turns off n-channel transistor 80 while turning on p-channel transistor 78, which will drive the gate of transistor 74 high. Since the source of transistor 78 is connected to the output pad rather than to the 3-volt power supply, its output is charged up to the output pad's voltage, which reaches 5 volts.

The n-well 100 is no longer driven to 3 volts by p-channel transistor 74, which turns off as its gate goes high. Instead, the n-well 100 is driven up to 5 volts by p-channel transistor 76, which has its gate tied to 3 volts. As the output rises above $3+|V_{tp}|$ volts, transistor 76 turns on as its source-to-gate voltage rises and exceeds the threshold. N-well tap 93 couples 5 volts from the output pad to the n-well body terminals of p-channel transistors 74, 76, 78, 88, 90, 92, 96, 98, 70 and 72. Thus parasitic p+-to-n-well diodes connected to the output pad will not be forward biased.

In particular, p-channel driver transistors 70, 72 do not draw any D.C. current from a forward-biased parasitic diode at their drains, even though connected to the output pad, since their n-well has been raised up to 5 volts by transistor 76. No second power supply or charge pump is required since the output pad supplies the 5 volt signal through transistor 76.

P-channel driver transistors 70, 72 also do not draw large currents through their channels because gate PG1, PG2 are also driven to 5 volts. The low signal O-LOW turns on p-channel transistor 88, which drives 5 volts onto gate PG1 through transistor 92, and onto gate PG2 through transistor 96 when IN is kept low. Tying transistor 88's source to the n-well 100 rather than directly to the output pad allows for a slight time delay to charge gates PG1, PG2. This allows tine for n-channel transistors 94, 84, 86 to turn off and isolate gate PG1, PG2 from the rest of the device.

Latch-up is also prevented since all the p-channel transistors that receive 5 volts are in the n-well 100 are charged up to 5 volts. Since n-well 100 is charged up by a connection to the output pad, rather than by a charge pump or a separate supply, the voltage of n-well 100 closely follows the output pad. Any variations such as overshoot in the 5-volt high level on the output pad does not cause latch-up, as could be the case if an independent supply or charge pump were used.

ADVANTAGES OF THE INVENTION

An isolating output buffer is operated by a low-voltage power supply, yet can be put in a high-impedance state and not draw significant current when the bus is being driven by another driver to a higher voltage, such as 5 volts. The output buffer is implemented entirely in CMOS without using bipolar transistors. Use of a charge pump, a second power-supply voltage, or a complex op-amp comparator is avoided. The isolating output buffer is faster because it does not use a transmission gate in the speed path.

Eliminating the transmission gate saves chip area. Since the transmission gate is eliminated, the size of transistors 92, 94 can be small, and this can further on save chip area. For the split driver, transistors 90 and 88 can be shared by two drivers to also save chip area.

ALTERNATE EMBODIMENTS

Several other embodiments are contemplated by the inventor. For example, the layout of the n-well taps and strapping of these well taps can be varied. Separate wells could be used for some of the p-channel transistors such as the driver transistor, while still being biased to the 5-volt potential of the bus. While a connection to an external bus has been described, it is understood that this connection may be made through bonding wires, pins, and pads, or other means. Indeed, the invention could be used on a single substrate between blocks having differing power-supply voltages, in which case the bus could lie entirely within a single device or IC. The exact sizes of the transistors can be varied according to the technology used or design goals or requirements.

The exact power-supply voltages in any particular embodiment can vary. The detailed description has referred to a 3-volt and a 5-volt supply, but the 3-volt supply could easily be replaced with a 2.0-, 3.3-volt or a 3.5-volt supply. Indeed, the invention could be used for adapting a 5-volt output buffer to operate with a 7, 10, or 12-volt bus. Thus the specific voltages used are a matter for those of skill in the art to vary while still falling within the spirit of the invention.

While a one or two p-channel driver transistors have been described, it would also be feasible to have one bias circuit control the biasing of several additional driver transistors. Also, the p-channel driver transistor could itself be composed of several individual transistors, such as transistors in parallel or in series.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An over-voltage tolerant output buffer comprising:
    an output pad for connecting to an external bus, the external bus being driven to an over-voltage above a power-supply voltage for the output buffer;
    a p-channel driver transistor, coupled to the output pad, for driving the output pad to a higher voltage, the p-channel driver transistor being controlled by a gate node;
    an n-well node, coupled to the p-channel driver transistor, for providing a substrate bias to the p-channel driver transistor;
    a fixed-gate transistor, coupled between the output pad and the n-well node, for coupling the n-well node to the output pad when the over-voltage appears on the output pad;
    an isolating gate for driving the gate node of the p-channel driver transistor, the isolating gate including an n-channel transistor for pulling the gate node to ground when the p-channel driver transistor is to be enabled, the isolating gate also including a p-channel transistor for coupling the gate node to a source node when the p-channel driver transistor is not enabled;
    a well-source transistor, coupled between the n-well node and the source node, for coupling the over-voltage from the n-well node to the source node when the over-voltage appears on the output pad; and
    a supply transistor, coupled between the power-supply voltage and the source node, for applying the power-supply voltage to the source node when the over-voltage does not appear on the output pad,
    whereby the over-voltage on the output pad is applied to the gate node of the p-channel driver transistor through the fixed-gate transistor, the n-well node, the well-source transistor, and the p-channel transistor in the isolating gate.

2. The over-voltage tolerant output buffer of claim 1 wherein a gate of the fixed-gate transistor is coupled to the power-supply voltage.

3. The over-voltage tolerant output buffer of claim 2 wherein the fixed-gate transistor is a p-channel transistor with a substrate terminal connected to the n-well node.

4. The over-voltage tolerant output buffer of claim 3 wherein the well-source transistor and the supply transistor are p-channel transistors with substrate terminals connected to the n-well node.

5. The over-voltage tolerant output buffer of claim 4 further comprising:
    a well transistor, coupled between the power-supply voltage and the n-well node, for connecting the n-well node to the power-supply voltage when the over-voltage is not applied to the output pad.

6. The over-voltage tolerant output buffer of claim 5 further comprising:
    a logic gate, having an input coupled to the output pad, for activating an isolation signal when the over-voltage is applied to the output pad;
    an inverting n-channel transistor, having a gate coupled to the isolation signal, for generating an inverted isolation signal, the inverting n-channel transistor having a source coupled to ground;
    an inverting p-channel transistor, having a gate coupled to the isolation signal, for generating the inverted isolation signal, the inverting p-channel transistor having a source coupled to the output pad.

7. The over-voltage tolerant output buffer of claim 6 wherein the isolation signal is applied to a gate of the well-source transistor, the isolation signal causing the well-source transistor to couple the n-well node to the source node when the over-voltage appears on the output pad;

wherein the inverted isolation signal is applied to a gate of the well transistor, the inverted isolation signal causing the well transistor to couple the power-supply voltage to the n-well node when the over-voltage is not applied to the output pad.

8. The over-voltage tolerant output buffer of claim 7 wherein the output pad is coupled to a gate of the supply transistor, the over-voltage on the output pad disabling the supply transistor.

9. The over-voltage tolerant output buffer of claim 8 further comprising:

a second p-channel driver transistor, coupled to the output pad, for driving the output pad to the higher voltage, the second channel driver transistor being controlled by a second gate node; and a second isolating gate for driving the second gate node of the second p-channel driver transistor, the second isolating gate including a second n channel transistor for pulling the second gate node to ground when the second p-channel driver transistor is to be enabled, the second isolating gate also including a second p-channel transistor for coupling the second gate node to the source node when the second p-channel driver transistor is not enabled;

whereby the isolating gate and the second isolating gate are each connected to the source node driven by the well-source transistor to the over-voltage.

10. The over-voltage tolerant output buffer of claim 9 wherein the second isolating gate is a NAND gate with sources of p-channel transistors coupled to the source node rather than directly to the power-supply voltage.

11. The over-voltage tolerant output buffer of claim 10 wherein the second p-channel driver transistor is enabled after the p-channel driver transistor is enabled, whereby driver enablement is skewed.

12. An output buffer for driving a bus comprising:

an input;

a circuit output;

an n-well substrate node;

a middle node;

a p-channel driver transistor, having a gate controlled by a driver-gate node, a drain coupled to the circuit output, and a source coupled to a power supply;

a logic gate, having the circuit output as an input, for generating a first signal;

a high-voltage inverter, receiving the first signal, for generating a second signal;

a first p-channel transistor, having a gate coupled to the power supply, a drain coupled to the n-well substrate node, and a source coupled to the circuit output;

a second p-channel transistor, having a gate coupled to the second signal, a source coupled to the power supply, and a drain coupled to the n-well substrate node;

a third p-channel transistor, having a gate controlled by the circuit output, a drain coupled to the middle node, and a source coupled to the power supply;

a fourth p-channel transistor, having a gate controlled by the first signal, a drain coupled to the middle node, and a source coupled to the -well substrate node;

a source-isolated inverter including:

an n-channel transistor with a gate coupled to the input, a drain coupled to the driver-gate node, and a source coupled to ground; and a p-channel transistor with a gate coupled to the input, a drain coupled to the driver-gate node, and a source coupled to the middle node, whereby the source-isolated inverter drives the p-channel driver transistor from the middle node which is driven through the four p-channel transistor, the n-well substrate node, and the first p-channel transistor from the circuit output when the first signal is low.

13. The output buffer of claim 12 wherein the n-well substrate node is coupled to substrate areas under channels of the first, second, third, and fourth p-channel transistors, the p-channel driver transistor, and the channel transistor in the source-isolated inverter.

14. The output buffer of claim 13 wherein the n-well substrate node is not directly connected to the power supply but is connected to the power supply through the second p-channel transistor or is connect to the circuit output by the first p-channel transistor.

15. The output buffer of claim 14 wherein the high-voltage inverter comprises:

a p-channel transistor, having a gate controlled by the first signal, a drain driving the second signal, and a source coupled to the circuit output;

an n-channel transistor, having a gate controlled by the first signal, a drain driving the second signal, and a source coupled to a ground, whereby the source of the p-channel transistor is driven by the over-voltage from the circuit output.

16. The output buffer of claim 15 wherein the logic gate has a first input connected to the circuit output and a second input connected to an output-disabling signal, wherein the first signal is low when the output-disabling signal indicates that the output buffer not drive the circuit output and the circuit output is in a high state, whereby the circuit output is connected to the n-well substrate node when the first signal is low.

17. An output buffer with a high-impedance state comprising:

well-bias means, coupled to an output, for connecting a well to the output when the output is in a high state and the output buffer is in the high-impedance state, and for otherwise connecting the well to a power supply;

pullup driver means for driving the output to a high state when the output buffer is not in the high-impedance state and a gate node is in a low state;

source-bias means for connecting the well to a middle-source node when the output is in a high state and the output buffer is in the high-impedance state, and for otherwise connecting the middle-source node to a power supply; and isolated inverter means, receiving an input indicating a state to drive the output to, for driving the gate node from the middle-source node when the output is to be driven to a low state or the output buffer is in the high-impedance state, and for driving the gate node to ground when the output is to be driven to a high state and the output buffer is not in the high-impedance state, whereby an over-voltage on the output is coupled through the well-bias means to the well, and through the source-bias means to the middle-source node, and through the isolated inverter means to the gate node of the pullup driver means when the output buffer is in the high-impedance state.

18. The output buffer of claim 17 wherein the well-bias means comprises two p-channel transistors having substrates and drains connected to the well, with a source of one of the p-channel transistors coupled to the power supply and the source of another of the channel transistors coupled to the output;

wherein the source-bias means comprises two p-channel transistors having substrates connected to the well, and drains coupled to the middle-source node, with a source of one of the p-channel transistors coupled to the power supply and the source of another of the p-channel transistors coupled to the well.

19. The output buffer of claim 18 wherein the pullup driver means comprises a p-channel transistor having a gate couple to the gate node, a substrate connected to the well, a drain coupled to the output, and a source coupled to the power supply.

20. The output buffer of claim 19 wherein the pullup driver means further comprises a second channel transistor having a gate couple to a second gate node, a substrate connected to the well, a drain coupled to the output, and a source coupled to the power supply;

further comprising:

second isolated inverter means, receiving the input indicating the state to drive the output to, for driving the second gate node from the middle-source node when the output is to be driven to the low state or the output buffer is in the high-impedance state, and for driving die gate node to ground when the output is to be driven to the high state and the output buffer is not in the high-impedance state, whereby a split driver is used for pullup.

* * * * *